United States Patent [19]

Miki et al.

[11] Patent Number: 4,968,988
[45] Date of Patent: Nov. 6, 1990

[54] TIME INTERLEAVED ANALOG-DIGITAL CONVERTER AND A METHOD FOR DRIVING THE SAME

[75] Inventors: Takahiro Miki; Hideki Ando, both of Hyogo, Japan

[73] Assignee: Mitsubishi Denki Kabushiki Kaisha, Tokyo, Japan

[21] Appl. No.: 274,437

[22] Filed: Nov. 22, 1988

[30] Foreign Application Priority Data

Nov. 25, 1987 [JP] Japan ............................ 62-298124

[51] Int. Cl.$^5$ ............................................. H03M 1/06
[52] U.S. Cl. .................................... 341/141; 341/118
[58] Field of Search ................ 341/141, 155, 131, 118

[56] References Cited

U.S. PATENT DOCUMENTS 4,342,984  8/1982  Berke et al. ......................... 341/141
4,345,241  8/1982  Takeuchi et al. .................... 341/141

OTHER PUBLICATIONS

ISSCC 80: "Time Interleaved Converter Arrays", by W. C. Black et al., Session I: A/D and D/A Converters, 2/13/80, pp. 14, 15 and 254.

Primary Examiner—William M. Shoop, Jr.
Assistant Examiner—Sharon D. Logan
Attorney, Agent, or Firm—Lowe, Price, Leblanc, Becker & Shur

[57] ABSTRACT

A time interleaved analog-to-digital converter includes a plurality of analog-to-digital subconverters which are monolithically integrated in an array on a semiconductor chip and are sequentially activated into sampling and conversion operation in the time interleaved fashion for converting a received analog signal into a digital form. If an analog-to-digital subconverter in the i-th row of the j-th column of the array is activated at one sampling time in the sequential activation, an analog-to-digital subconverter in the k-th row of the l-th column is subsequently activated, where i, k, j and l bear the relations expressed by:

$$i-2 \leq k \leq i+2 \text{ and } j-2 \leq l \leq j+2.$$

The sequential activation of the analog-to-digital subconverter array assures that the analog-to-digital subconverters disposed in physical proximity to one another are successively activated, thus greatly improving the differential linearity of the analog-to-digital converter characteristics.

9 Claims, 6 Drawing Sheets

TIME INTERLEAVED ANALOG-DIGITAL CONVERTER AND A METHOD FOR DRIVING THE SAME

BACKGROUND OF THE INVENTION

1. Field of the Invention

This invention relates to an improvement of an analog-digital converter, and in particular to improving conversion accuracy of a high sampling rate monolithic analog-to-digital converter array for sequentially driving a plurality of analog-to-digital converter circuits in time interleaved manner.

2. Description of the Prior Art

One conventional technique for converting an analog signal to a digital signal at a high speed is a flash conversion technique where comparators formed on one chip are parallel-operated in order to convert an incoming analog signal very rapidly into an n-bit digital signal.

Figure 1:
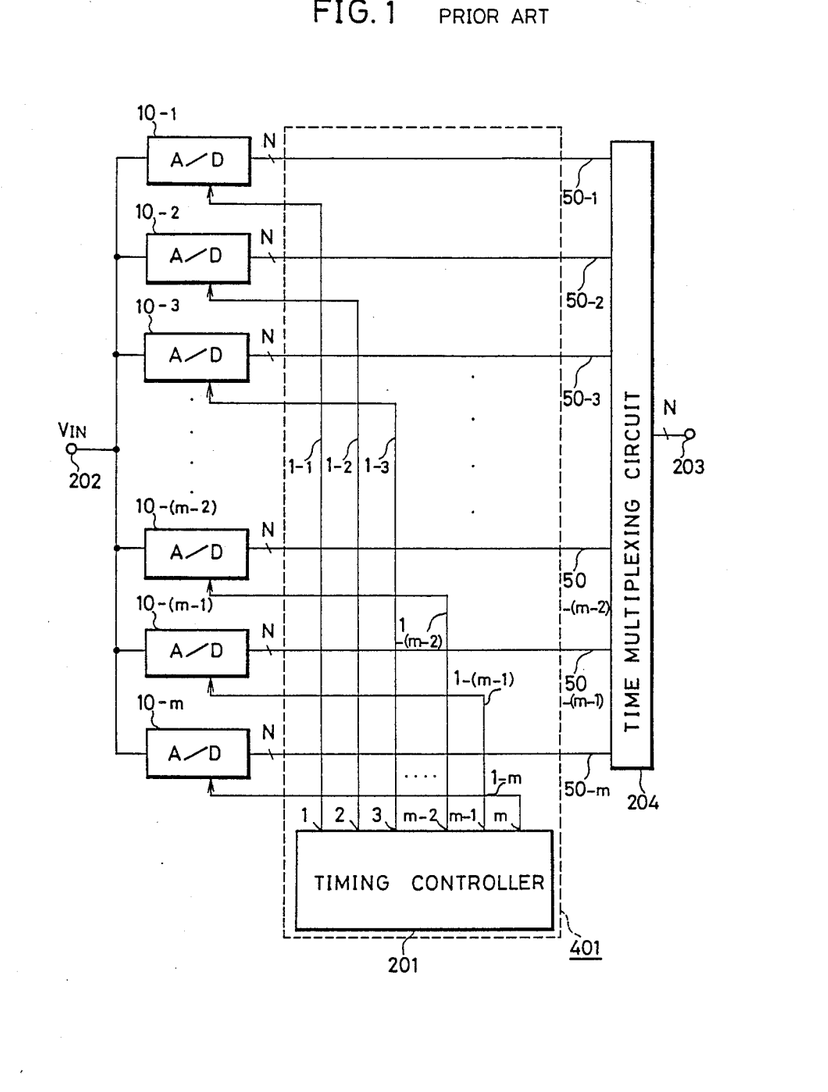
FIG. 1 is a block diagram showing an overall arrangement of a conventional time interleaved A/D converter.
Figure 2:
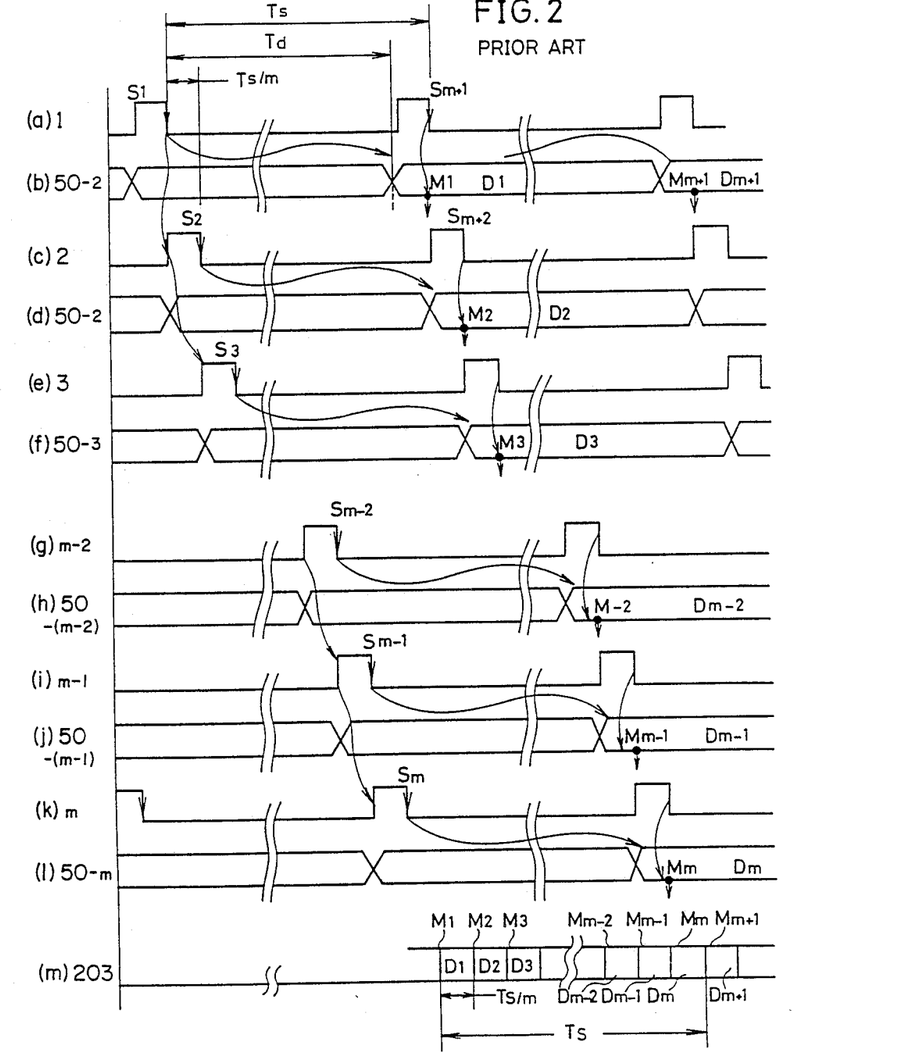
FIG. 2 is a timing diagram for the conventional time interleaved A/D converter of FIG. 2.

The flash conversion technique is less advantageous since it requires a large number of comparators to be provided on a semiconductor chip, thereby making it necessary for the chip size to be increased. In an attempt to overcome the shortcomings of the flash conversion technique, W. C. Black et al. proposed a high-speed analog-to-digital converter (hereinafter also referred to as an A/D converter) which provides a reduced chip size and less power consumption in an article entitled, "Interleaved Converter Arrays", 1980 IEEE International Solid-State Circuits Conference Digest of Technical Papers, Feb. 13, 1980, pp. 14–15. W. C. Black et al. teach to arrange a plurality of analog-to-digital converters in the array (of columns or of rows and columns) and to activate or enable sequentially these analog-to-digital converters to obtain analog-to-digital converted outputs in a time divisionally multiplexed fashion. Referring to FIGS. 1 and 2, description is made of the architecture and operation of the conventional high-speed analog-to-digital converter. The analog-to-digital converter of FIG. 1 is designed to achieve a conversion rate m times as great as the sampling rate of an individual analog-to-digital converter unit using a plurality of analog-to-digital converter units in the number of m.

As shown in FIG. 1, the A/D converter includes a plurality of n-bit A/D converter units or subconverters 10-1 to 10-m which are arranged in one-dimensional array. The A/D subconverters 10-1 to 10-m are each supplied with an analog input signal $V_{IN}$ via an input terminal 202. A timing controller 401 provides operating timing or sample/hold timing for each of the analog-digital subconverters. The timing controller 401 comprises a timing controlling unit 201, and a plurality of signal lines 1-1 to 1-m which connect the output terminals 1 through m of the timing control units to the control inputs of the A/D subconverters 10-1 through 10-m. The timing controller unit 201 operates to supply active control signals from its output terminals 1 through m to the control inputs of the A/D subconverters 10-1 through 10-m at predetermined time intervals.

The A/D converter also includes a time multiplexing circuit 204 for selectively receiving output signals from the A/D subconverters 10-1 through 10-m. The time multiplexing circuit 204 functions to sequentially connect the output lines 50-1 through 50-m of the A/D subconverters to its output terminal 203. The output of each of the A/D subconverters 10-1 through 10-m is of an n-bit signal, while the outputs of output lines 50-1 to 50-m and the time multiplexing circuit 204 have an n-bit width. The operation of the analog-to-digital converter of FIG. 1 is now described with reference to FIG. 2 which shows a timing diagram for the analog-to-digital converter. In FIG. 2, the waveforms (a)–(l) are illustrative of operating timings for the A/D subconverters 10-1 to 10-m, respectively, and the output data stream to be applied to the output terminal 203 is illustrated at (m). The timing at which each of the A/D subconverters 10-1 to 10-m samples the incoming analog signal is provided by the timing controller 401. The analog input signals sampled by the A/D subconverters 10-1 to 10-m are converted into n-bit digital data signals which are fed out therefrom with a predetermined time delay. Assuming that the sampling period of the individual A/D subconverters to be Ts, this sampling period Ts corresponds to the period of time of operation during which the timing controller unit 201 supplies one activating signal from all of its output terminals 1 through m. Thus, the activating signals are sequentially applied to the subconverters 10-1 to 10-m from the timing controller unit 201 at the interval of Ts/m.

When the A/D subconverter 10-1 is activated by the enabling signal from the output terminal 1 of the timing controller unit 201, the activated subconverter samples the analog input signal being supplied thereto at the moment S1 and converts it into an N-bit digital signal. At the time S2 upon the lapse of the time of Ts/m after the sampling time S1, the unit 201 feeds a sampling enable signal from the terminal 2 to the control input of the second A/D subconverter 10-2. Upon receipt of the sampling enable signal, the subconverter 10-2 operates to sample the analog input value being applied thereto. In a similar manner, the timing controller unit 201 successively generates the sampling enable signals at the time interval Ts/m and supplies them to the control inputs of the A/D converters 10-3 to 10-m in sequence. In response to the sequential application of the sampling enable signal, the A/D subconverters 10-3 to 10-m function one after another to sample the analog input value $V_{IN}$ being supplied thereto at the time of sampling. As the final A/D subconverter 10-m finishes the sampling, the timing controller unit 201 provides the sampling enable signal at the output terminal 1. Accordingly, during the single sampling cycle of a single A/D subconverter, m A/D subconverters sequentially perform the sampling of the applied analog signal.

On the other hand, each of the A/D subconverters 10-1 to 10-m provides the N-bit digital value with the delay of Td with respect to the sampling time. This means that the input terminals 50-1 to 50-m of the time multiplexing circuit 204 each receive the digital data signal Di from the respective A/D subconverters which corresponds to the sampled analog input upon the lapse of the time Td after the analog input has been sampled at the time Si. Phrased differently, the A/D subconverters generate digital output signals sequentially upon the passage of the delay time Td after the sampling time at the interval of Ts/m. In the sampling cycle of operation, at the time M1 upon the completion of the delay time Ts after the time S1 when the A/D subconverter 10-1 has sampled the analog input, the time multiplexing circuit 204 is activated to select the digital signal supplied to the input terminal 50-1 and transfers it to the output terminal 203. In this manner, the timing multiplexing circuit 204 operates, under the control of the timing controller 401, in synchronization with the generation of the sampling enable signals from the timing controller unit 201, thereby successively linking the input terminals 50-1 through 50-m to the output terminal 203. The time multiplexing circuit 204 provides m digital data signals to its output terminal 203 in a time duration of Ts.

With the A/D converter of the time interleaved array design, although the individual A/D subconverters have a relatively long sampling period, the use of the time multiplexing circuit 204 for sequential selection of the digital outputs from the A/D subconverters, in effect, reduces substantially the sampling period to 1/m of Ts. This in turn is effective to provide digital signals at the output terminal 203 which are sampled and converted at a high speed of a sampling rate 1/m times greater than that of the individual A/D subconverters.

The fact that all of the A/D subconverters in the conventional time interleaved A/D converter array are monolithically integrated on a single chip poses some serious problems as will be explained below.

Figure 3:
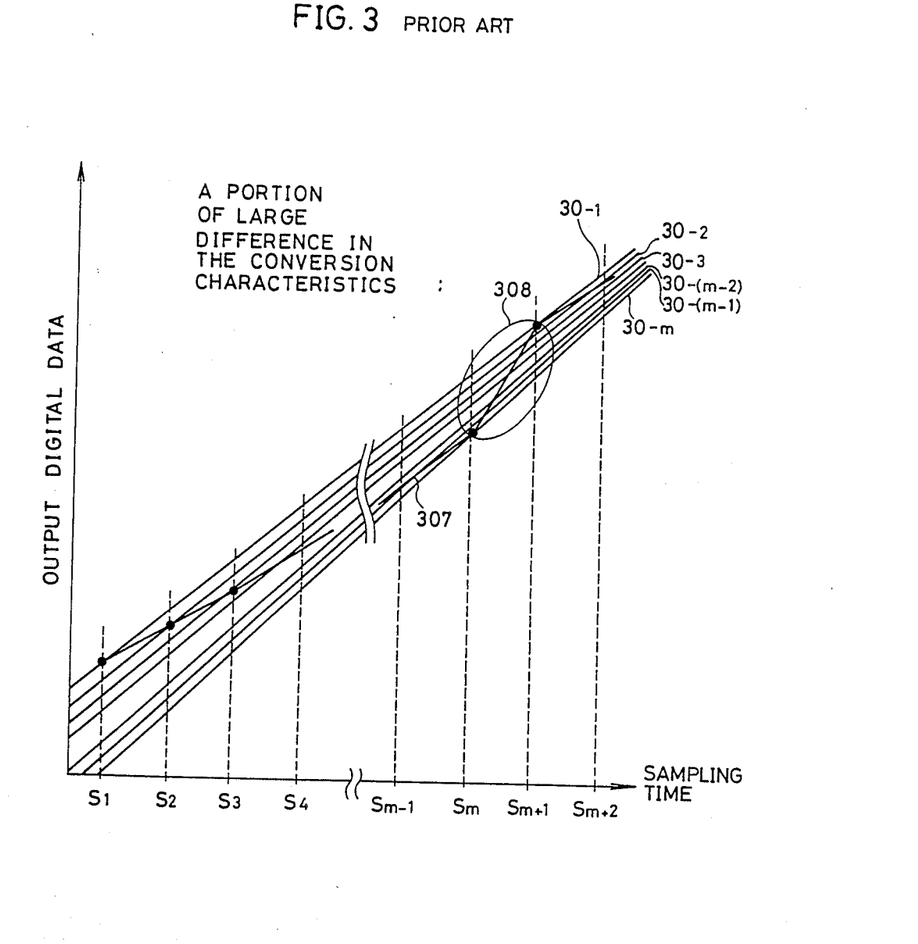
FIG. 3 is a graphic representation showing analog-to-digital conversion characteristics of the A/D subconverters incorporated in the time interleaved A/D converter of FIG. 1.

Referring to FIG. 3, there are illustrated plotted curves representing the conversion characteristics of the individual A/D subconverters 10-1 to 10-m as indicated by the curves 30-1 to 30-m, and of the whole A/D converter as indicated by the bold curve 307. It is assumed that a linearly increasing ramp signal is applied as an analog input signal to be A/D converted.

From the ideal point of view, the conversion characteristics of the A/D subconverters 10-1 to 10-m should coincide with one another. However, as a practical matter, they never coincide because the component devices such as transistors have different performance characteristics for the various reasons traceable into the manufacturing process, and because of the thermal gradient in the semiconductor substrate on which the component devices are formed. As far as the operation characteristics of the component devices and the thermal distribution on a chip are concerned, the more remote the subconverters are disposed, the greater the difference of the devices characteristics and the thermal distribution. All these give rise to a corresponding difference in the conversion characteristics of the A/D subconverters. Even in a design of the A/D converter where the A/D subconverters are arranged discretely on, for example, a printed circuit board instead of being monolithically formed on a semiconductor chip, the subconverters are placed under widely differing heat conditions due to the thermal gradient. Thus, the subconverters at remote locations on the print circuit board exhibit different conversion characteristics.

When the A/D subconverters 10-1 to 10-m perform the sampling operation of an incoming analog signal in a sequence and manner as stated previously, the outputs in digital form obtained at the converter output terminal 203 are shown moving from one conversion characteristic curve to another starting on the characteristic curve 30-1 at the time S1. Then, the overall conversion characteristic of all the subconverters combined is obtained as indicated by the bold curve 307.

As the sampling operation goes on, the A/D subconverter 10-m performs a sampling operation, followed by a sampling operation of the A/D subconverter 10-1. Thus, as shown by a encircled portion 308 of a large difference in the conversion characteristics in FIG. 3, the converted outputs appearing at the output terminal 203 have a larger difference between the time S1 and the time S2. More specifically, in the conventional time interleaved A/D converter, the A/D subconverters included therein are sequentially activated in a roll-over manner. Therefore, the A/D subconverters with a large physical separation are successively activated to provide an output data, and it follows that much different levels of the A/D converted signals are generated in that region. In other words, the conventional time interleaved A/D converter has a drawback that the differential linearity, which is one of the most important characteristics in the A/D converter performance, tends to be degraded and poor.

Although the aforementioned article by W. C. Black et al does describe the architecture and operation of the time interleaved A/D converter array, it makes no mention of the problems of non-uniform characteristics and the degraded differential linearity in the performance of the converter array.

SUMMARY OF THE INVENTION

It is an object of the invention to provide an improved time interleaved A/D converter capable of converting an analog signal into digital form at high speed and accuracy.

It is another object of the invention to provide an A/D converter having an improved differential linearity characteristics.

It is still another object of the invention is to provide a driving method for a time interleaved A/D converter which greatly improves the differential linearity thereof.

In a time interleaved A/D converter including a plurality of A/D subconverters according to the invention, any given one of the plurality of the A/D subconverters and the one which is to be activated immediately after or before the given subconverter are disposed at locations close to each other. Specifically, the sequential activation of the plurality of the A/D subconverters is carried out under the direction of a timing controller so that any two subconverters to be succeedingly activated in a sequence are spaced substantially the same small physical distance apart from each other.

Briefly stated, the time interleaved A/D converter of the invention includes: a plurality of A/D subconverters arranged in an array; a timing controller for activating the plurality of the A/D subconverters in a predetermined sequence; a multiplexer for selectively transferring in a predetermined sequence the digital outputs from the A/D subconverters, wherein the A/D subconverters are sequentially activated in such a manner that any two successive digital signals selected by the multiplexer are supplied by the two A/D subconverters which are positioned at locations spaced apart from each other a predetermined small distance within at the maximum two pitches of the subconverter.

Phrased differently, in the process of signal sampling and conversion, if the A/D subconverter in the i-th row and the j-th column of the converter array is enabled into operation at one sampling time, then activated at the next sampling time is the A/D subconverter disposed in the k-th row and the l-th column, wherein i and l satisfies the following relations:

$$i-2 \leq k \leq i+2 \text{ and } j-2 \leq l \leq j+2.$$

In general when a plurality of A/D subconverters are arranged in an array on a semiconductor chip or a printed circuit board, the difference in the signal converting characteristics of any two subconverters varies with the physical distance between them. Specifically, the larger the distance, the greater the difference. The difference in the conversion characteristics for analog-to-digital converted output signals obtained at the output terminal of the multiplexer circuit can be made substantially the same if the A/D subconverters are sequentially activated into signal sampling and converting operation in a manner that any two subconverters to be succeedingly activated in the sequence of operation are spaced apart substantially the equal distance from each other through all the A/D subconverters. This sequential operation improves the differential linearity in the characteristics of the A/D converter.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
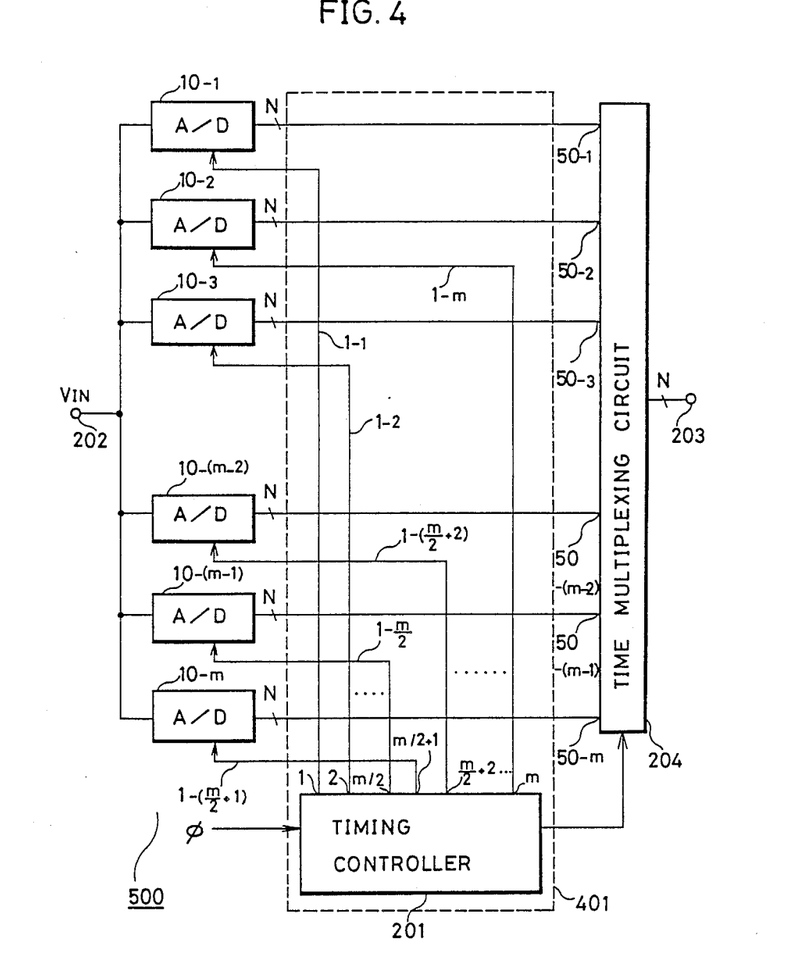
FIG. 4 is a block diagram showing an overall arrangement of a time interleaved A/D converter according to one preferred embodiment of the invention.

Referring to FIG. 4, there is illustrated an overall arrangement of a time interleaved A/D converter according to one embodiment of the invention. In FIG. 4, the portions of the time interleaved A/D converter corresponding to those in the conventional time interleaved A/D converter of FIG. 1 are indicated by identical reference numerals.

The time interleaved A/D converter of the present invention includes a plurality of A/D subconverters 10-1 to 10-m which are arranged in one-dimensional array of a single column. These A/D subconverters sequentially sample the analog input signal $V_{IN}$ applied thereto through an input terminal 202 in response to the sampling enable signals from the timing controller unit 201. For the convenience of description, m A/D converters are employed (where m is an even number). The timing controller unit 201 of the timing controller 401 functions to sequentially provide sampling enable signals on its output terminals 1 to m in response to a clock signal $\phi$.

The time multiplexing circuit 204 selectively transfers digital outputs from the A/D subconverters 10-1 through 10-m in response to the control signal from the timing controller unit 201.

The timing controller 401 includes a plurality of leads 1-1 through 1-m which electrically connect the output terminals 1 through m of the timing controller unit 201 and the control inputs of the A/D subconverters such that any two subconverters to be successively activated in the sampling operation are positioned at locations spaced substantially the equal distance within the maximum distance of 2P (two pitches of a subconverter) apart throughout the A/D subconverters. More specifically, the timing controller unit 201 has the output terminal 1 connected to the A/D subconverter 10-1 by a lead 1-1, and the output terminal 2 to the A/D subconverter 10-3 by a lead 1-2. In this manner, output terminals 1 through m/2 of the unit 201 are connected to the alternate A/D subconverters from the top to the bottom in the converter column by the leads 1 to 1-(m/2). The interconnection arrangement is to be of a folding arrangement at the output (m/2)+1 which is connected to the A/D subconverter 10-m. That is, the outputs (m/2)+1 through m are connected to the alternate A/D subconverters in the direction from the bottom to the top of the converter column. In this way, the odd-numbered A/D subconverters in the column are coupled by the leads 1-1 to 1-(m/2) sequentially to the output terminals 1 through m/2 of the unit 201 in a downward direction, and even-numbered A/D subconverters in the column are then coupled by the leads 1-(m/2+1) to 1-m sequentially to the output terminals (m/2)+1 through m in an upward direction.

With the above described interconnecting arrangement, alternate A/D subconverters are succeedingly selected to be activated in a sampling operation. It is noted that the distance between the A/D subconverter 10-(m-1) and the A/D subconverter 10-m to be activated next, and the distance between the A/D subconverter 10-2 and the A/D subconverter 10-1 are each half as large as those among remaining subconverters. If the pitch of one subconverter is represented by P, the subconverters spaced 2P apart are successively activated except at the folding point in the interconnection arrangement.

The timing multiplexing circuit 204 operates to sequentially select and send N-bit digital signals supplied to its input terminals 50-1 through 50-m out to the output terminal 203.

The timing for the sampling enable signals generated by the timing control unit 201 as well as the switching timing of the time multiplexing circuit 204 are assumed to be identical to those shown in FIG. 2. In operation, the timing controller unit 201 provides sampling enable signals sequentially on the output terminals 1 through m at a cycle of Ts, as in the case of the conventional A/D converter of FIGS. 1 and 2. These sampling enable signals are fed to the control inputs of the A/D subconverters 10-1 through 10-m. In the sampling operation, the odd-numbered subconverters in the converter column are first activated into sampling and conversion operation sequentially downward. Each activated A/D subconverter provides N bit digital data to the time multiplexing circuit 204. After the lower most odd-numbered subconverter 10-(m-1) in the column has been activated, a sequential activation reverses its direction and drives the even-numbered A/D subconverters into sampling and conversion operation one after another in an upward succession through the converter column. The sequentially activated A/D subconverters provide analog-to-digital converted signals to their corresponding input terminals 50-1 through 50-m of the timing multiplexing circuit 204, which functions to selectively couple its input terminals to the output terminal 203 in a downward sequence. Hence, the output terminal 203 of the time multiplexing circuit 204 is supplied with the analog-to-digital converted signals in each sampling cycle by the odd-numbered subconverters 10-1, 10-3, ... 10-(m-1) in this order, and then by the even-numbered subconverters 10-m, 10-(m-2), ... 10-2 in this order. At the end of one complete sampling cycle, that is, when all of the m A/D subconverters have been activated, the activation of the A/D subconverters shifts from the subconverter 10-2 to the subconverter 10-1 which are physically positioned adjacent each other. Thus, in sharp contrast to the aforementioned conventional arrangement of the A/D converter, the time interleaved A/D converter of the present invention exhibits little difference in the conversion characteristics between the two subconverters to be successively activated at the termination of one complete sampling cycle and at the start of the next sampling cycle. This leads to less different digital outputs obtained at the converter output in that region.

Figure 5:
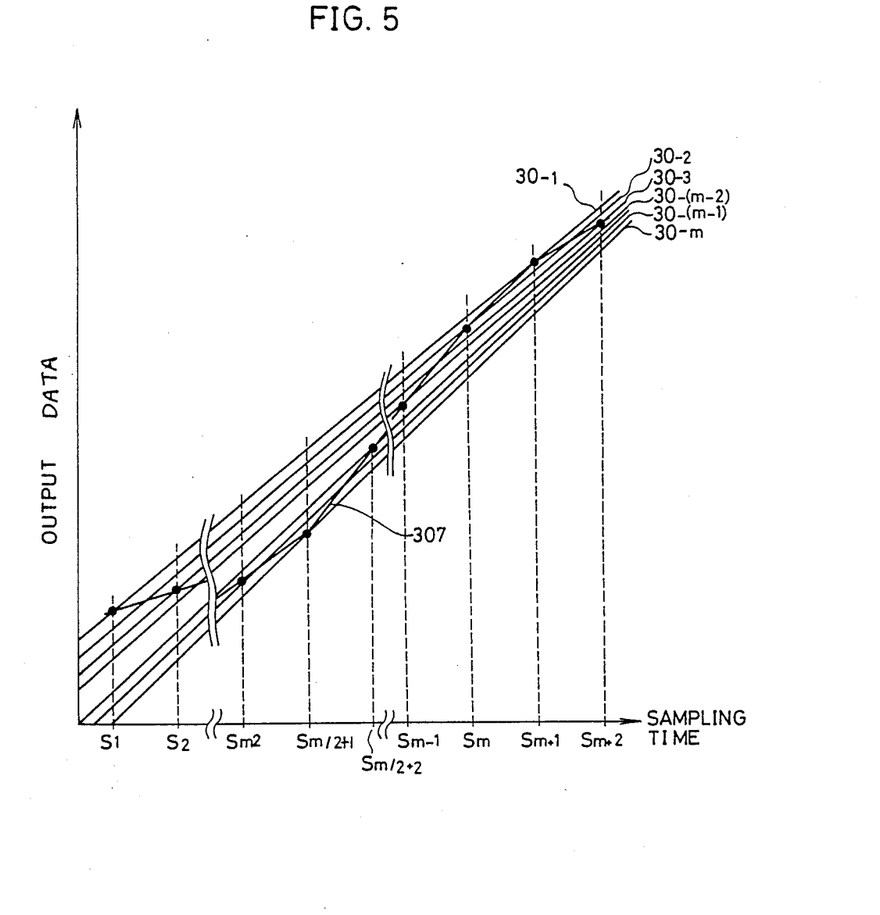
FIG. 5 is a graphic representation showing analog-to-digital conversion characteristics of the A/D subconverters incorporated in the time interleaved A/D converter of FIG. 4.

FIG. 5 shows the digital outputs of the A/D converter of this invention produced at each sampling times S1 to $S_{m+2}$. The conversion characteristic curves 30-1 through 30-m are for the A/D subconverters 10-1 through 10-m, respectively.

It is noted that even in an improved converter design where the A/D subconverters are monolithically arranged in an array on a semiconductor chip (i.e. the chip 500 in FIG. 4), the subconverters exhibit slightly varying conversion performances, however, the conversion characteristics vary in one direction. The greater the physical distance between adjacent subconverters, the greater the difference in the conversion characteristics between them as discussed previously. However, the difference in the conversion characteristics is substantially equalized throughout the subconverters using the sequential activation of the invention where the subconverters in physical proximity are successively selected to be activated all the time as shown in FIG. 4. As shown in FIG. 5, an A/D converted digital signal to be applied to the output terminal 203 moves on alternate conversion characteristics curves from the curve 30-1 toward the curve 30-m and then returning to the curve 30-1 as the sampling time advances. Then, the digital output signals at the sampling times S1 to $S_{m+2}$ are connected to provide a synthesized conversion curve 307 of the A/D converter as shown by the bold line in FIG. 5.

As can be seen from the overall synthesized conversion characteristics curve 307, there is only a small variation of the analog-to-digital converted outputs between successive sampling times, thereby eliminating any large change or shift in the overall synthesized conversion characteristics to reduce an error in the differential linearity.

Figure 6:
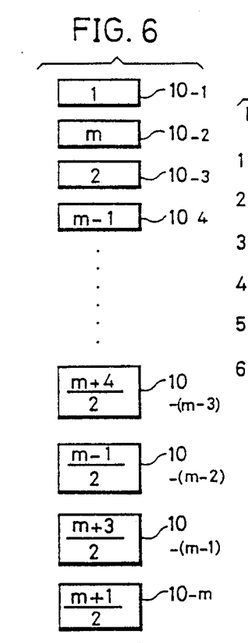
FIG. 6 is a schematic illustration showing the arrangement of A/D subconverters in a time interleaved A/D converter according to another embodiment of the invention and a sequence in which the A/D subconverters are activated.

In the preceding preferred embodiment, the A/D converter includes an even number of the A/D subconverters. However, when it is intended to incorporate an odd number of the A/D subconverters, they may be activated in a sequence as shown in FIG. 6. In a sampling and conversion cycle of FIG. 6, the odd-numbered subconverters are sequentially selected downward during the former half cycle of one sampling cycle, followed by the upward activation of the even-numbered subconverters during the latter half cycle of the sampling cycle. The A/D converter repeats that activation sequence in operation.

Figure 7:
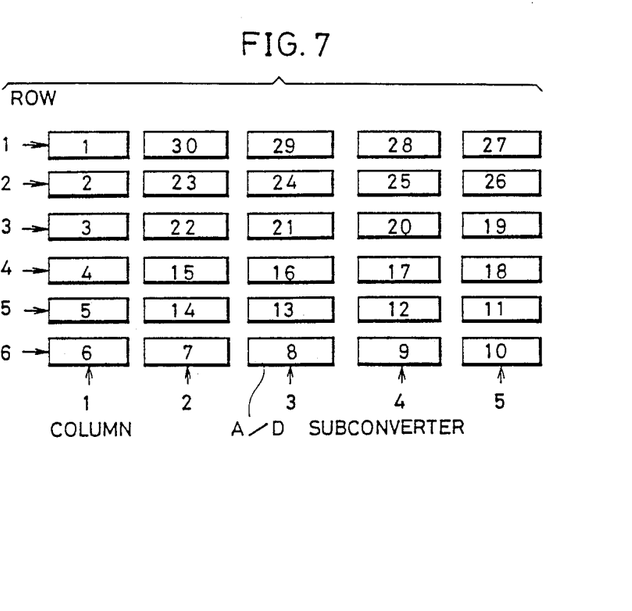
FIG. 7 is a schematic illustration showing the arrangement of an A/D subconverter array in a time interleaved A/D converter according to still another embodiment of the invention and a sequence in which the A/D subconverter array is activated.

The A/D subconverters have been described as being arranged in one-dimensional column in the previous embodiments. In another embodiment of the invention, the A/D converter may include a plurality of A/D subconverters arranged in a two-dimensional array of rows and columns. The subconverter array is sequentially activated in a similar manner as in the preceding embodiments, thereby to achieve similar improved conversion characteristics. FIG. 7 shows a 6-row and 5-column array of A/D subconverters. The numerical references 1 through 30 are entered in the rectangular forms representing the subconverters to indicate the sequence in which the subconverters are activated. In operation, the A/D subconverters in the first column are initially activated in downward sequence, and the A/D subconverters in the sixth row are then activated left to right. Thereafter, the sequential activation continues on the rest of the subconverters in the first to fifth rows in the second to fifth columns in a serpentine fashion from the subconverter in the fifth row of the fifth column to the subconverter in the first row of the second column as represented by a series of numerical references. As will be readily understood from the illustrated configuration of the subconverter array, the A/D subconverter to be initially activated in one sampling cycle is disposed as close as possible to the one to be activated at the end of the sam sampling cycle.

Figure 8:
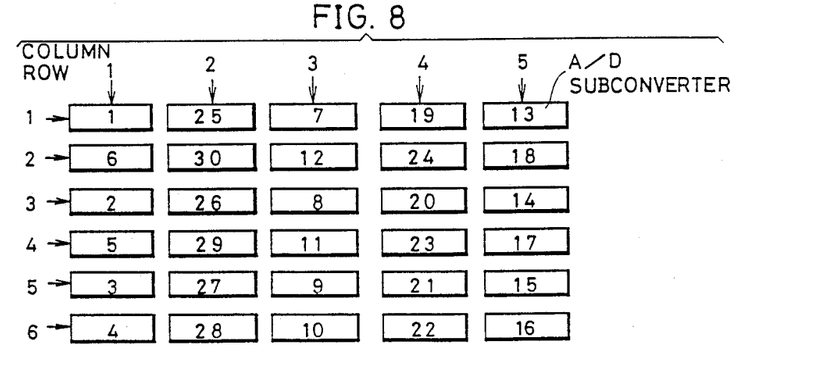
FIG. 8 is a schematic illustration showing the arrangement of A/D subconverters in a time interleaved A/D converter according to still further another embodiment of the invention and a sequence in which the A/D subconverters are activated.

Alternatively, the subconverter array may be sequentially activated in a manner as shown in FIG. 8 where similar numerical references 1 through 30 are entered to indicate the order of the subconverters to be activated. In operation, the first column is initially selected and the subconverters in this column are sequentially activated in an alternate fashion identical to that explained with reference to FIG. 4 or FIG. 6. The third column is then selected for activation, and all subconverters in the third column are sequentially activated as in the first column. Next, the fifth column is selected for sequential activation of the subconverters therein also as in the first column, followed by the selection of the fourth column and then the second column for the activation of the subconverters therein in a similar sequence.

As will be understood from the foregoing description, the present invention provides an improved A/D converter in which the A/D subconverter array is sequentially activated into sampling and conversion operation so that any two subconverters to be successively activated are disposed within the maximum distance of 2P, where P represents a pitch of a subconverter in the row or column direction. The arrangement of the A/D subconverters and the sequential activation thereof effectively reduces the difference in the overall synthesized conversion characteristics of the A/D converter. As a result, there is found only small variation in the overall synthesized conversion characteristic curve, improving greatly the differential linearity of the converter performance.

In the illustrated embodiments of the invention, the A/D subconverters have been described as being monolithically formed on a semiconductor chip. However, this invention is not limited thereto and is also applicable to the A/D converter in which subconverters are arranged in an array of a column or of rows and columns on a print circuit board because a thermal gradient also exists even in such a case.

Also in the illustrated embodiments, interconnections between the timing controller unit and the A/D subconverters through the connection leads for carrying the sampling enable signals from the controller to the subconverters are modified in order to carry out the activation on the A/D subconverters in a desired sequence. Instead, the same sequential activation of the A/D subconverters may be realized through the control of the outputs of the timing controller unit without modification of the interconnections between the controller unit and the subconverters.

As discussed previously, in the novel arrangement of the A/D converter of the present invention, a plurality of the A/D subconverters are activated into the sampling and conversion operation in such sequence that an A/D subconverter activated at one sampling time is positioned in physical proximity to the one activated at the immediately preceding sampling time. This sequential activation of the A/D subconverters with a small physical separation results in relatively uniform A/D conversion characteristics throughout all the subconverters. This contributes to keeping any large shift from appearing in the overall synthesized conversion of the A/D converter, and to providing almost flawless differential linearity of the converter characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high-speed analog-to-digital converter including a plurality of analog-to-digital subconverters arranged in an array and coupled to a common analog input terminal, each said subconverters for sampling an incoming analog signal at the analog input terminal and converting it to a digital output signal, said converter comprising:
   means for periodically activating said analog-to-digital subconverters into sampling and conversion operation in a first predetermined sequence; and
   means for selectively transferring in a second predetermined sequence the digital output signals received from said analog-to-digital subconverters to be sequentially activated,
   said activating means including first means for selecting said analog-to-digital subconverters so that any two of said subconverters to be successively activated in said first predetermined sequence are physically separated from each other by no more than one subconverter in the array.

2. An analog-to-digital converter according to claim 1 wherein said subconverters are arranged in a matrix of numbered rows and columns and said first means comprises means for selecting an analog-to-digital subconverter disposed in the i-th row of the j-th column in said array at one sampling time in the periodic activation sequence and then at the sampling time immediately subsequent to said one sampling time selecting an analog-to-digital subconverter disposed in the k-th row of the l-th column in said subconverter array where i, j, k and l represent natural numbers and bear the relations expressed as follows;

$$i-2 \leq k \leq i+2 \text{ and } j-2 \leq l \leq j+2.$$

3. An analog-to-digital converter according to claim 2 wherein said first means sequentially selects said analog-to-digital subconverters such that the analog-to-digital subconverter selected at the start of one periodic activation sequence and the analog-to-digital subconverter selected at the end of said one periodic activation sequence are spaced apart from each other by a distance less than 2P and 2Q where P is a pitch of the analog-to-digital subconverter in the direction of the row of the array and Q is a pitch of the analog-to-digital subconverter in the direction of the column of said array.

4. An analog-to-digital converter according to claim 3 wherein the analog-to-digital subconverter selected at the start of one periodic activation sequence and the analog-to-digital subconverter selected at the end of the one periodic activation sequence are positioned adjacent to each other either in the direction of the row, in the direction of the column of said array, or in the diagonal direction of said array.

5. An analog-to-digital converter according to claim 1 wherein said plurality of analog-to-digital subconverters are arranged in one-dimensional array and being consecutively numbered, and said first means sequentially selects the odd-numbered analog-to-digital subconverters in numerical order until the analog-to-digital subconverter bearing the largest odd number is selected, and after completion of activation of all the odd numbered subconverters said selecting means sequentially selects the even-numbered analog-to-digital subconverters in reverse numerical order.

6. An analog-to-digital converter according to claim 1 wherein said plurality of analog-to-digital subconverters are arranged in a two-dimensional array of rows and columns, said rows and columns being numbered, and said first means sequentially in one periodic activation sequence the analog-to-digital subconverters in the first column; and after the analog-to-digital subconverter in the last row of the first column has been selected, said first means sequentially selects the remaining analog-to-digital subconverters in said last row in a direction away from the first column; and after the analog-to-digital subconverter in the last column in said last row has been selected, said first means sequentially selects the remaining analog-to-digital subconverters in the next neighboring row in a direction opposite to the direction in which said analog-to-digital subconverters in the last row have been sequentially selected; and upon the completion of the sequential selection of the analog-to-subconverters in said neighboring row, said first means sequentially selects the rest of the analog-to-digital subconverters in another neighboring row in a direction opposite to the direction in which said analog-to-digital subconverters in a preceding row have been selected, and said first means continues to sequentially select all the remaining analog-to-digital subconverters in this manner.

7. An analog-to-digital converter according to claim 1 wherein said plurality of analog-to-digital subconverters are arranged in an array of rows and columns, said rows and columns of the array being succeedingly numbered, and said first means sequentially selects the odd-numbered subconverters in the first column in numerical order and then the even-numbered subconverters in said first column in reverse numerical order, after which said selecting means sequentially selects the remaining odd-numbered columns of subconverters and sequentially selects the subconverters in each selected column in a similar fashion as in said first column, and upon completing the selection of the subconverters in the column bearing the largest odd-number, said first means sequentially selects the even-numbered columns in reverse numerical order and sequentially selects the subconverters in each selected column in a similar fashion as in said first column.

8. A method for driving an analog-to-digital converter having a plurality of analog-to-digital subconverters arranged in an array and coupled to a common analog input terminal for sampling an analog input signal supplied to the common input terminal and converting it into a digital signal comprising the steps of:

periodically activating said analog-to-digital subconverters into sampling and conversion operation in a first predetermined sequence such that any two of said analog-to-digital subconverters to be successively activated in said periodical activating sequence are physically separated from each other by no more than one subconverter within said array; and selectively transmitting the digital signals generated by said sequentially activated analog-to-digital subconverters in a second predetermined sequence.

9. A method for driving an analog-to-digital converter according to claim 8 wherein said subconverter array comprises succeedingly numbered rows and columns, and said step of sequentially activating said analog-to-digital subconverters comprises the step of;

activating an analog-to-digital subconverter positioned in the i-th row of the k-th column in said array at one sampling point in said periodic activating sequence and subsequently activating an analog-to-digital subconverter disposed in the k-th row of the l-th column in said periodic sequence where i, j, k and l represent natural numbers and bear the relations expressed as follows;

$i-2 \leq k \leq i+2$ and $j-2 \leq l \leq j+2$.

* * * * *